United States Patent
Alfani et al.

(10) Patent No.: US 9,577,128 B2
(45) Date of Patent: Feb. 21, 2017

(54) CEMENTITIOUS PRODUCT SUITABLE IN PARTICULAR AS SUBSTRATE FOR A THIN FILM PHOTOVOLTAIC MODULE, AND METHOD OF PRODUCTION THEREOF

(75) Inventors: Roberta Alfani, Bergamo (IT); Claudia Capone, Cassina de'Pecchi (IT); Marco Plebani, Gorle (IT)

(73) Assignee: ITALCEMENTI S.P A., Bergamo (IT)

( * ) Notice: Subject to any disclaimer, the term of this patent is extended or adjusted under 35 U.S.C. 154(b) by 0 days.

(21) Appl. No.: 13/641,516

(22) PCT Filed: Apr. 19, 2011

(86) PCT No.: PCT/IB2011/051689
§ 371 (c)(1),
(2), (4) Date: Oct. 16, 2012

(87) PCT Pub. No.: WO2011/132143
PCT Pub. Date: Oct. 27, 2011

(65) Prior Publication Data
US 2013/0034691 A1    Feb. 7, 2013

(30) Foreign Application Priority Data
Apr. 20, 2010 (IT) .............................. MI2010A0670

(51) Int. Cl.
H01L 31/0392 (2006.01)
C04B 28/02 (2006.01)
B28B 7/36 (2006.01)
H02S 20/25 (2014.01)
C04B 111/00 (2006.01)

(52) U.S. Cl.
CPC .......... *H01L 31/0392* (2013.01); *B28B 7/364* (2013.01); *C04B 28/02* (2013.01); *H02S 20/25* (2014.12); *C04B 2111/00318* (2013.01); *Y02B 10/12* (2013.01); *Y02E 10/50* (2013.01); *Y10T 428/24355* (2015.01)

(58) Field of Classification Search
CPC ............ C04B 20/1051; C04B 20/1055; C04B 20/1062; C04B 20/1066; C04B 20/1074; C04B 20/1077; C04B 28/06; C04B 28/02; C04B 2111/00318; E04D 7/005; H01L 31/048; H01L 31/0392; Y10T 428/24355; Y10T 428/24364; H02S 20/25; B28B 7/364; Y02E 10/50; Y02B 10/12
USPC ......................................... 428/141, 143, 145
See application file for complete search history.

(56) References Cited

U.S. PATENT DOCUMENTS

| | | | |
|---|---|---|---|
| 7,695,559 B1 * | 4/2010 | Chartier et al. ............. | 106/692 |
| 2004/0031219 A1 | 2/2004 | Banister | |
| 2005/0221098 A1 * | 10/2005 | Azzopardi et al. ........... | 428/446 |
| 2007/0219333 A1 * | 9/2007 | Shimono et al. ............. | 526/249 |
| 2008/0102286 A1 * | 5/2008 | Fukuda et al. ............... | 428/446 |
| 2008/0163794 A1 * | 7/2008 | Tanaka et al. ................ | 106/705 |
| 2008/0230110 A1 * | 9/2008 | Freedman ..................... | 136/246 |
| 2009/0133739 A1 * | 5/2009 | Shiao et al. .................. | 136/251 |
| 2009/0133749 A1 | 5/2009 | Yonezawa | |
| 2009/0242010 A1 * | 10/2009 | Herner .......................... | 136/244 |
| 2011/0143923 A1 * | 6/2011 | Bette et al. ................... | 502/159 |
| 2011/0259571 A1 * | 10/2011 | Yamasaki et al. ............ | 165/185 |

FOREIGN PATENT DOCUMENTS

| | | | |
|---|---|---|---|
| KZ | 7195 | 2/1999 | |
| RU | 2194827 | 12/2002 | |
| RU | 2215100 | 10/2003 | |
| WO | WO 2010044443 A1 * | 4/2010 | ............. F28F 13/18 |

OTHER PUBLICATIONS

Miller et al.; "Surface roughness criteria for cement paste nanoindentation"; Cement and Concrete Research 38, 2008; 467-476.
Felekoglu et al.; "Effects of PSD and surface morphology of micro-aggregates on admixture requirement and mechanical performance of micro-concrete"; Cement & Concrete Composites 29; 2007; 481-489.
Alfani et al.; "The use of the capillary rheometer for the rheological evaluation of extrudable cement-based materials"; Rheol Aeta (2007) 46:703-709.
Lauermann I E. et al.; "CuInS2-Based Thin Film Solar Cells on Roof Tile Substrates"; 17th European Photovoltaic Solar Energy Conference, 22-26; Oct. 2001; Munich, Germany.
International Search Report for Application PCT/IB2011/051689 dated Jul. 26, 2011.
Office Action from the Kazakhstan Patent Ofice for application 2012/1633.1, dated Feb. 7, 2014. (Translation enclosed).

* cited by examiner

*Primary Examiner* — Nathan Van Sell
(74) *Attorney, Agent, or Firm* — Abelman, Freyne & Schwab

(57) ABSTRACT

The present invention relates to a substrate for a thin film photovoltaic module, characterized in that it is a cementitious product with average surface roughness Ra not higher than 500 nm. The invention also relates to the cementitious product as such, the thin film photovoltaic module comprising it, and a method of molding both of them.

7 Claims, 1 Drawing Sheet

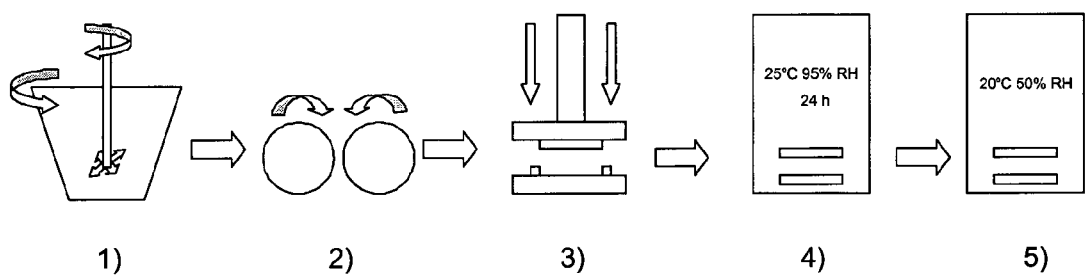

CEMENTITIOUS PRODUCT SUITABLE IN PARTICULAR AS SUBSTRATE FOR A THIN FILM PHOTOVOLTAIC MODULE, AND METHOD OF PRODUCTION THEREOF

CROSS-REFERENCE TO RELATED APPLICATIONS

This application is a National Phase of PCT/IB2011/051689, filed 19 Apr. 2011, which claims priority from IT No. MI2010A000670, filed 20 Apr. 2010, the disclosures of which are incorporated herein by reference.

FIELD OF THE INVENTION

The present invention relates to products suitable in particular for being coated with a thin film for constructing a photovoltaic module.

BACKGROUND ART

A thin film photovoltaic module, applied to a supporting substrate, converts solar energy to electrical energy by the photovoltaic effect. In particular and for example, CIGS is a thin photovoltaic film technology that uses diselenides of copper, indium, and gallium, and is regarded as very promising from the standpoint of performance.

With a view to application of a photovoltaic film of the CIGS type, the substrates, generally made of a plastic or vitreous material, must have suitable properties especially if employing a method of application of the film under vacuum and at high temperature. The essential conditions for a good result are deposition of a continuous, homogeneous film that is as thin as possible, also with a view to economy of material with photovoltaic properties, considering the very high costs.

SUMMARY OF THE INVENTION

The main purpose of the present invention is to propose a substrate suitable for being coated with a thin film with photovoltaic properties so as to construct a photovoltaic module with a film that is continuous, homogeneous and as thin as possible, ideally compatible, both functionally and aesthetically, with the architectural context in which it is used.

For this purpose, the present invention proposes a substrate suitable for constructing a thin film photovoltaic module, characterized in that it is a cementitious product, in particular a sheet, in which the surface to be coated with said thin film has an average roughness Ra not higher than 500 nm (nanometers). Said average surface roughness Ra is preferably not higher than 350 nm, and more preferably not higher than 200 nm.

The invention also relates to a thin film photovoltaic module characterized in that it comprises, as substrate for application of said film, a cementitious product, in particular a sheet, with average surface roughness Ra not higher than 500 nm. For the purposes of the invention, the critical average roughness of the support or substrate defined above is thus generally less than the average thickness of the thin film with photovoltaic properties to be applied to said substrate, which is of the order of microns, thus making it possible to produce thin film photovoltaic modules, such as CIGS, that are continuous and homogeneous with reduced consumption of material with photovoltaic properties.

DESCRIPTION OF THE INVENTION

According to the invention, "thin film photovoltaic module" means any module made by thin film technology, for example based on amorphous silicon, CIS or CIGS and CdTe or on components of organic nature or organic-inorganic hybrid nature.

A preferred embodiment of the invention envisages application of the cementitious product as substrate for CIGS technology.

With regard to said substrate, it refers in particular to prefabricated cement products for use in the building sector, preferably for non-structural applications such as coating and roofing elements, either of the horizontal type or of the vertical type, such as sheets of small thickness.

These cementitious substrates prove particularly suitable for the so-called building integration photovoltaic (BIPV) field, for ideal integration of photovoltaic modules in the urban architectural context. Examples of application of products and sheets for photovoltaic systems are: cladding panels for façades, fencing panels, canopies, sheets and tiles for flooring, louvers, and more generally, sun protection systems. Within the scope of the present invention, the following are to be regarded as suitable as substrates: prefabricated three-dimensional objects to be used in the area of construction, constituted of a solid material obtained by hydration of cement mixes, i.e. of mixtures comprising the following components:

I. a hydraulic binder
II. one or more aggregates
III. a rheology modifier
IV. a super-plasticizer additive
V. water.

According to the invention, the cementitious products are obtained by a method of moulding comprising phases of intimate mixing of said components from I to V, preferably by means of calendering, and subsequent moulding of said mixtures to finished products of small thicknesses and reduced weight. Moulding can be carried out by any suitable means of forming the material to obtain cementitious products of well-defined shape, applying pressure and temperature for a variable time depending on the process parameters, compacting the mixture in the plastic state in a mould that gives the final product the desired geometry and surface roughness profile.

Compression moulding is preferably used.

Cementitious products are thus produced with thickness generally between 1 and 10 mm, preferably 2-7 mm and more preferably 3-6 mm.

The present invention also relates to a thin film photovoltaic module applied to a substrate constituted of said cementitious product with average surface roughness Ra not higher than 500 nm as described above. So as to ensure a correct procedure for deposition of the photovoltaic film, the cementitious product formed as described above is strength-tested in the vacuum conditions required by the deposition process as described above.

Said components from I to V according to the present invention are now described in detail.

I. "Hydraulic binder" means a pulverized material in the dry solid state which, when mixed with water, gives plastic mixtures that are able to set and harden, even under water, such as a cement. A clinker usable for preparation of a binder for the present invention is any Portland cement clinker as defined according to standard UNI EN 197.1, i.e. a hydraulic material composed of at least two thirds by weight of calcium silicates (3CaO.SiO$_2$) and (2CaO.SiO$_2$), the remainder being Al$_2$O$_3$, Fe$_2$O$_3$ and other oxides.

The broad definition of hydraulic binder according to the present invention includes both the white, grey or pigmented cements defined according to the aforementioned standard UNI EN 197.1, and the so-called cements for impounding weirs, cementitious binding materials and hydraulic limes as defined in Italian Law 26 May 1965 N. 595, and inorganic silicates.

To form a substrate according to the present invention, it is possible to use binders based on calcium sulphoaluminates, such as the compounds described in patents and/or patent applications WO2006/18569, EP-A-1306356 and EP-A-0181739, such as those derived from the calcium sulphoaluminate clinkers described in the review "Green Chemistry for sustainable cement production and Use" by John W. Phair Green Chem., 2006, 8, 763-780, in particular in chapter 5.3 on page 776, as well as from the calcium sulphoaluminate clinkers described in the article "Calcium sulphoaluminates cements—low energy cements, special cements" J. H. Sharp et al., Advances in Cement Research, 1999, 11, No. 1, pp. 3-13. Alternatively, aluminous and sulpho-ferro-aluminous cements as described in Advances in Cement Research, 1999, 11, No. 1, January, 15-21, can also be used appropriately. In a preferred embodiment of the invention, the sulpho-aluminous cement Alipre® Cement from Italcementi and the Portland cement Ultracem® 52,5R from Italcementi are used as binder.

II. The aggregates or inert materials, also called inert aggregates, according to the present invention can be fine aggregates such as sand, and fillers defined in standard UNI EN 206. The granulometry, i.e. the maximum diameter of the aggregates, must be less than the final thickness of the product; for the purposes of the critical surface roughness of the substrate that they are to form, said granulometry must be less than 1 mm, preferably less than 500 µm and more preferably less than 250 µm.

The aggregates can be suitably selected from calcareous, quartz or silico-calcareous aggregates, of any form (crushed, spherical) as well as of the lightened type to reduce the final weight of the product.

Optionally, the mixture can also contain one or more auxiliary substances that are usual in this field, such as fillers of mineral or pozzolanic origin, pigments of organic and/or inorganic nature etc. Mineral or pozzolanic fillers mean microsilica, fumed silica, slag, fly ash, metakaolin, natural pozzolans, natural limestones and precipitated calcium carbonates.

In a preferred aspect of the invention, Cugini filler (<250 µm), Maccarini impalpable (<250 µm), and Cugini aggregate (0.8-1.4 mm) are used as component II.

III. For the purposes of making the product according to the present invention, the cementitious mixture must contain at least one rheology modifier that imparts plastic type of behaviour during calendering and moulding. These rheology modifiers include a variety of derivatives of starch, of proteins and of cellulose ethers; according to the present invention, modified and unmodified cellulose ethers, with viscosity values between 500 mPa·s and 120000 mPa·s, are preferably used.

In a preferred aspect of the invention, Culminal® C4051 from Hercules is used as component III.

IV. For the purposes of making the product according to the present invention, the cementitious mixture must contain at least one additive as super-plasticizer, preferably polycarboxylic, added either in the solid phase or in the form of aqueous solution. In a preferred aspect of the invention, Cimfluid Adagio P1 from Axim Fr and Melflux 1641 F from BASF are used as component IV.

DESCRIPTION OF THE DRAWINGS

For the purpose of better understanding of the characteristics and advantages of the invention, a non-limiting example of practical implementation of a method for moulding a cementitious product of the invention is presented below, referring to the appended drawings.

Referring to FIG. 1, the phases of a preferred embodiment of the process for production of products made of cementitious material according to the invention are illustrated schematically as a flow chart.

A mixer of the intensive type (1) is charged with:
a cementitious-base solid mixture comprising one or more components selected from cement, sand, aggregates, fillers of mineral or pozzolanic origin, rheology modifiers, super-plasticizers, pigments,
water, stored in a liquids feeder,
optionally additives, in liquid form.

The solid-phase components are mixed in mixer (1) for a time preferably between 30 seconds and 15 minutes, depending on the characteristics of the mixer and the ambient temperature, until a homogeneous mixture is obtained. Then the liquid components, including water, are added and mixing continues for a time between 30 seconds and 10 minutes, once again depending on the characteristics of the mixer and the ambient temperature. At the end of the mixing phase, the mixture can be in various semisolid forms, from moist powder with small granular agglomerates, to a cohesive, homogeneous paste.

The mixture thus obtained is sent to a mixing machine or homogenizer (2), which is preferably a high-shear calender mixer, which gives a plastic, cohesive laminar material of thin and uniform thickness.

This is then supplied to the moulding phase (3), in moulds having a micrometric surface roughness, preferably metal moulds of the type used for cementitious applications coated at least partially with materials such as polyethylene terephthalate such as Mylar® and the like, polycarbonate, polyamide, polymethylmethacrylate such as Plexiglas® and the like, able to impart to the cementitious product, during the moulding phase, the surface and roughness characteristics according to the invention.

The moulding phase is carried out in controlled temperature conditions, between 25 and 150° C., preferably between 50 and 120° C., more preferably between 70 and 100° C. The moulding pressure applied is between 1 bar and 200 bar, preferably between 40 bar and 150 bar, more preferably between 60 bar and 120 bar. The moulding time depends on the conditions of temperature and pressure and on the cementitious composition, and is between 1 and 60 minutes.

Cementitious products are thus produced with thickness between 1 and 10 mm, preferably 2-7 mm and more preferably 3-6 mm.

The moulded product, after extraction from the mould 3, undergoes curing and seasoning, shown respectively by 4 and 5 in FIG. 1, with the product being held in a climate chamber, inside a perforated box, to avoid direct contact with water or other materials that might impair the final surface characteristics. The optimum curing conditions preferably envisage a temperature of 25° C. and relative humidity (RH) of 95%, for 24 hours.

Next, the product is seasoned in a chamber conditioned at 20° C. and relative humidity of 50%.

In the products according to the present invention, the average surface roughness Ra is measured by means of a contactless optical profilometer, such as 3D Talysurf CCI Lite (Taylor-Hobson), equipped with an automatic stage and with autofocus. The system uses scanning green light interferometry to obtain images and measurements of the parts analysed, supplying quantitative information about surface structure without physical contact with it. The light beam, after passing through the optical path of the microscope, is split in two inside the interferometry objective. One part is reflected from the sample while the other part is reflected from a high-quality reference surface inside the objective.

The two beams are recombined and the resultant light is directed onto a solid-state camera. The interference between the two wavefronts generates an image formed from light and dark bands, called interference fringes, which are indicative of the surface structure of the part analysed. Since the interference fringes are only produced when the surface being analysed is at the focus, a vertical scan must be performed to be able to acquire interferograms that characterize the level of each pixel making up the matrix of the CCD camera. Scanning is performed by means of a piezo-electric transducer placed at the base of the optical head of the microscope. The system is equipped with various types of objectives (50×, 20×, 10×, 5×, 2.5×), use of which depends on the surface characteristics of the sample to be examined.

While the objective performs the scan, the camera records images of the intensity of the interference fringes. Analysis of the range of frequencies permits localization of the level for each pixel unambiguously and extremely accurately. The measurements obtained are both three-dimensional and two-dimensional: the vertical measurement (perpendicular to the surface being examined) is obtained by interferometry, while the lateral measurements (in the plane of the sample) are obtained from the calibration of the magnification generated by the objective.

The 3D data characterizing the surface, obtainable using the technique described, are as follows:
height parameters: Sq, SSk, Sku, Sp, S, Sz, Sa, defined according to standard ISO 25178;
planarity parameters: FLTt, FLTp, FLTv, FLTq defined according to standard ISO 12781;
The 2D data characterizing the surface, obtainable using the technique described, are as follows:
height parameters—roughness profile: Rp, Rv, Rz, Rc, Rt, Ra, Rq, Rsk, Rku, defined according to standard ISO 4287;
spacing parameters—roughness profile: RSm, Rdq, defined according to standard ISO 4287;
peak parameters—roughness profile: RPc, defined according to standard ISO 4287.

For proceeding to deposition of the photovoltaic film, a sheet of substrate formed according to the present invention is preferably strength-tested in the vacuum conditions required by the film deposition process. In particular the sheet is submitted, in a vacuum chamber, to gradual variation of pressure up to 3.2×10−5 mbar. The variation in surface roughness recorded shows the compatibility of the cementitious substrate with the simulated conditions of the process for deposition of the layer of photovoltaic film based on CIGS. Furthermore, a test with the sample held at 500° C. for one hour must not lead to changes in the roughness profile that are significant for the purposes of application of a thin film of the CIGS type.

The following examples of preparation of a cementitious product according to the invention illustrate the invention without limiting its scope in any way.

EXAMPLE 1

The solid components shown in Table 1 were mixed in an intensive mixer of the Eirich type for 3 minutes.

TABLE 1

| COMPONENTS | wt. % |
| --- | --- |
| Cement: Alipre ® Italcementi | 48.0 |
| Cugini filler (<250 μm) | 36.0 |
| Culminal ® C4051 | 1.0 |
| Cimfluid Adagio P1 | 0.3 |
| Water | 14.7 | with water/cement ratio = 0.30

On completion of this phase, water was added and mixing was continued for a further 3 minutes.

On completion, the mixture was in the form of moist granules. The solid mass was mixed in a calender kneader for 5 minutes.

Next, the material was compressed in a square mould, made of steel coated with Mylar®, with dimensions 25×25 cm and thickness 3 mm, at a pressure of 80 bar and at a temperature of 80° C., for 10 minutes. Curing of the moulded product took place in a climate chamber inside a perforated box, to avoid direct contact with water or other agents that might compromise the final surface characteristics of the product. The curing conditions were 25° C., 95% relative humidity, for 24 hours. After that, the product was stored in a chamber conditioned at 20° C. and 50% relative humidity.

The breaking stress, measured according to standard UNI EN ISO 10545-4 on test bars of thickness 3 mm, length 100 mm and width 20 mm, was found to be 25 MPa.

Measurement of the surface roughness Ra according to standard ISO 4287 showed a value of 16 nm.

With the composition of example 1, a sheet was produced for application of CIGS thin film photovoltaic modules.

To be able to proceed to deposition of the photovoltaic film, the sheet formed as described above was strength-tested in the vacuum conditions required by the deposition process. In the test, the sheet was submitted, in a vacuum chamber, to gradual variation of pressure up to 3.2×10−5 mbar. At the end of this test, the samples of sheet did not show significant changes in their surface roughness for the purposes of the performance required for application of the CIGS; in fact the value of Ra measured after the test was 20 nm.

The test with holding of the sample at 500° C. for one hour did not lead to changes in the roughness profile that were significant for the purposes of application of CIGS technology.

EXAMPLE 2

Essentially as described in example 1, but using the components shown in Table 2, a louver element was obtained.

TABLE 2

| COMPONENTS | wt. % |
| --- | --- |
| Cement: Alipre ® Italcementi | 48.0 |
| Cugini filler (<250 μm) | 36.0 |
| Culminal ® C4051 | 1.0 |

TABLE 2-continued

| COMPONENTS | wt. % |
|---|---|
| Melflux 1641 F | 0.3 |
| Water | 14.7 | water/cement = 0.30

The moulding process differed from example 1 in that the phase of moulding of the mixture was carried out at 100 bar and 90° C., for 8 minutes. The thickness of the moulded panel was equal to 4 mm.

The breaking stress, measured according to standard UNI EN ISO 10545-4 on test bars of thickness 4 mm, length 100 mm and width 20 mm, was equal to 26 MPa. The measured value of surface roughness, expressed as Ra according to standard ISO 4287, was 22 nm.

EXAMPLE 3

Essentially as described in example 1 but using the components according to Table 3, a roofing-tile for application of flexible solar cells was obtained.

TABLE 3

| COMPONENTS | wt. % |
|---|---|
| Cement: Ultracem 52,5R Italcementi | 46.9 |
| Cugini filler (<250 μm) | 35.2 |
| Culminal ® C4051 | 1.0 |
| Cimfluid Adagio P1 | 0.3 |
| Pigment: Rosso (red) 1020 Siof | 2.3 |
| Water | 14.3 | water/cement = 0.30

The moulding process differed from that in example 1 in that the moulding phase was carried out at 120 bar and 90° C., for 25 minutes.

The thickness of the roofing-tile was 5 mm.

The breaking stress, measured according to standard UNI EN ISO 10545-4 on test bars of thickness 4.5 mm, length 100 mm and width 20 mm, was found to be 24 MPa.

The measured value of surface roughness, expressed as Ra according to standard ISO 4287, was 18 nm.

EXAMPLE 4

Essentially as described in example 1, but using the components shown in Table 4, a roofing sheet was produced.

TABLE 4

| COMPONENTS | wt. % |
|---|---|
| Cement: Alipre ® Italcementi | 50.3 |
| Cugini filler (<250 μm) | 16.5 |
| Cugini aggregate (0.8-1.4 mm) | 21.1 |
| Melflux 1641 F | 0.7 |
| Cimfluid Adagio P1 | 0.4 |
| Water | 11.0 | water/cement = 0.22

The moulding process differed from that in example 1 by the presence of coarse aggregate (0.8-1.4 mm).

The thickness of the resultant sheet was 6 mm.

The surface roughness, expressed as Ra according to standard ISO 4287, was found to be 500 nm.

The invention claimed is:

1. A substrate for a thin film photovoltaic module, characterized in that it is a cementitious product with an average surface roughness Ra not higher than 500 nm formed by compression inside a mould fed with a mixture in a plastic state consisting essentially of a hydraulic binder, one or more aggregates, a rheology modifier, a super-plasticizer additive, and water.

2. A substrate according to claim 1, characterized in that it is a cementitious product with an average surface roughness Ra not higher than 350 nm.

3. A substrate according to claim 1, characterized in that it is a cementitious product with average surface roughness Ra not higher than 200 nm.

4. A substrate according to claim 1, characterized in that it has a thickness between 1 and 10 mm, preferably 2-7 mm and more preferably 3-6 mm.

5. A substrate according to claim 1, characterized in that it is in the form of sheet, or panel for ventilated facades and fences, or roof tile, or tile, or louver.

6. A substrate according to claim 1, characterized in that said aggregates have a granulometry smaller than 1 mm.

7. A thin film photovoltaic module, characterized in that it is made of a photovoltaic film applied to a cementitious substrate with an average surface roughness Ra not higher than 500 nm formed by compression inside a mould fed with a mixture in a plastic state consisting essentially of a hydraulic binder, one or more aggregates, a rheology modifier, a super-plasticizer, additive, and water.

* * * * *